United States Patent [19]
Tsuchiya et al.

[11] Patent Number: 4,922,186
[45] Date of Patent: May 1, 1990

[54] VOLTAGE DETECTOR

[75] Inventors: Yutaka Tsuchiya; Shinichiro Aoshima; Takuya Nakamura, all of Shizuoka, Japan

[73] Assignee: Hamamatsu Photonics Kabushiki Kaisha, Shizuoka, Japan

[21] Appl. No.: 240,641

[22] Filed: Sep. 6, 1988

[30] Foreign Application Priority Data

Sep. 7, 1987 [JP] Japan .................................. 223583

[51] Int. Cl.[5] ...................... G01R 15/07; G01R 31/28
[52] U.S. Cl. ................................ 324/96; 324/158 R; 350/356
[58] Field of Search ................. 324/96, 158 R, 117 R; 350/356, 374, 376; 356/368

[56] References Cited

U.S. PATENT DOCUMENTS 3,447,855  6/1969  Skinner ............................... 350/356

Primary Examiner—Ernest F. Karlsen
Attorney, Agent, or Firm—Finnegan, Henderson, Farabow, Garrett and Dunner

[57] ABSTRACT

A voltage detector comprises a pulse light source, a delay means, a dispersing prism made of an electro-optic material and a linear image sensor. The electro-optic material senses a voltage developing in a selected area of an object as a change of its refractive index. An optical path of a pulse light is changed by the dispersing prism according to the change of its refractive index. An output pulse light emerging from the dispersing prism is detected by a linear image sensor. A waveform of the periodic voltage pulses can be detected by gradually delaying a phase of the pulse light emitted from the light source. The voltage developing in one-dimensional positions in the object can be also detected by employing a dispersing prism extending along the positions to be detected and a two-dimensional detector.

11 Claims, 3 Drawing Sheets

VOLTAGE DETECTOR

BACKGROUND OF THE INVENTION

The present invention relates to a voltage detector for detecting the voltage developing in a selected area of an object to be measured such as an electric circuit. In particular, the present invention relates to a voltage detector of the type that detects voltage by making use of the change in light polarization that occurs in accordance with the voltage developing in a selected area of an object to be measured.

Various voltage detectors have been used to detect the voltage developing in a selected area of objects to be measured such as electric circuits. Conventional voltage detectors are roughly divided into two types: in one type, the probe is brought into contact with a selected area of an object to be measured and the voltage developing in that area is detected; and in the other type, the probe does not make contact with a selected area of an object to be measured and instead an electron beam is directed into that area and the voltage developing in it is detected.

Voltage changes rapidly in fine-line portions of objects such as integrated circuits that are small and complicated in structure, and a strong demand exists in the art for detecting such rapidly changing voltage with high precision without affecting the condition of the fine-line portions. However, this need has not been fully met by the prior art voltage detectors. With devices of the type that detect voltage by bringing the probe into contact with a selected area of an object to be measured, it is difficult to attain direct contact between the probe and a fine-line portion of the object of interest such as an integrated circuit. Even if this is successfully done, it has been difficult to correctly analyze the operation of the integrated circuit solely on the basis of the voltage information picked up by the probe. A further problem involved is that contact by the probe can cause a change in the operation of the integrated circuit. Voltage detectors of the type that employ an electron beam have the advantage that they are capable of voltage detection without bringing the probe into contact with an object to be measured. However, the area to be measured with such voltage detectors has to be placed in and exposed to a vacuum. In addition, the area to be measured is prone to be damaged by the electron beam.

The prior art voltage detectors have a common problem in that they are unable to operate quickly enough to follow rapid changes in voltage and hence fail to achieve precise detection of voltages that change rapidly as in integrated circuits.

With a view to solving these problems, it has been proposed by two of the present inventors (Japanese Patent Application No. 137317/1987 filed on May 30, 1987) that voltage be detected by making use of the polarization of a light beam that changes with the voltage developing in a selected area of an object to be measured.

A voltage detector operating on this principle is schematically shown in FIG. 7. The detector generally indicated by 50 is composed of the following components: an optical probe 52; a CW (Continuous-Wave) light source 53 typically in the form of a laser diode; an optical fiber 51 for guiding a light beam from the CW light source 53 into an optical probe 52 through a condenser lens 60; an optical fiber 92 for guiding reference light from the optical probe 52 into a photoelectric converter 55 through a collimator 90; an optical fiber 93 for guiding output light from the optical probe 52 into a photoelectric converter 58 through a collimator 91; and a comparator circuit 61 for comparing the electric signals from the photoelectric converters 55 and 58.

The optical probe 52 is equipped with an electro-optic material 62 such as an optically uniaxial crystal of lithium tantalate ($LiTaO_3$). The tip 63 of the electro-optic material 62 is worked into a frustoconical shape. The optical probe 52 is surrounded with a conductive electrode 64 and has at its tip 63 a coating of reflecting mirror 65 in the form of a thin metal film or a dielectric multilayer film.

The optical probe 52 further includes the following components: a collimator 94; condenser lenses 95 and 96; a polarizer 54 for selectively extracting a light beam having a predetermined polarized component from the light beam passing through the collimator 94; and a beam splitter 56 that splits the extracted light beam from the polarizer 54 into reference light and input light to be launched into the electro-optic material 62 and which allows the output light emerging from the electro-optic material 62 to be directed into an analyzer 57. The reference light is passed through the condenser lens 95 and thence launched into the optical fiber 92, whereas the output light emerging from the electro-optic material 62 is passed through the condenser lens 96 and thence launched into the optical fiber 93.

Voltage detection with the system shown in FIG. 7 starts with connecting the conductive electrode 64 on the circumference of the optical probe 52 to a predetermined potential, say, the ground potential. Then, the tip 63 of the probe 52 is brought close to the object to be measured such as an integrated circuit (not shown), whereupon a change occurs in the refractive index of the tip 63 of the electro-optic material 62 in the probe 52. Stated more specifically, the difference between refractive indices for an ordinary ray and an extraordinary ray in a plane perpendicular to the light-traveling direction will change in the optically uniaxial crystal.

The light beam issuing from the light source 53 passes through the condenser lens 60 and is guided through the optical fiber 51 to be directed into the collimator 94 in the optical probe 52. The light beam is polarized by the polarizer 54 and a predetermined polarized light having intensity I is launched into the electro-optic material 62 in the optical probe 52 through the beam splitter 56. Each of the reference light and the input light, which are produced by passage through the beam splitter 56, has an intensity of I/2. As already mentioned, the refractive index of the tip 63 of the electro-optic material 62 varies with the voltage on the object being measured, so the input light launched into the electro-optic material 62 will experience a change in the state of its polarization at the tip 63 in accordance with the change in refractive index of the latter. The input light is then reflected from the reflecting mirror 65 and makes a return trip through the electro-optic material 62, from which it emerges and travels back to the beam splitter 56. If the length of the tip 63 of the electro-optic material 62 is written as l, the state of polarization of input light launched into that material will change in proportion to the difference between refractive indices for the ordinary ray and the extraordinary ray and to the length 2l as well. The output light sent back into the beam splitter 56 is thence directed into the analyzer 57. The intensity of the output light entering the analyzer 57 has been decreased to I/4 as a result of splitting with the beam splitter 56. If the analyzer 57 is designed in such a way as to transmit only a light beam having a polarized component perpendicular to that extracted by the polarizer 54, the intensity of output light that is fed into the analyzer 57 after experiencing a change in the state of its polarization is changed from I/4 to $(I/4)\sin^2[(\pi/2)V/V_0]$ in the analyzer 57 before it is further fed into the photoelectric converter 58. In the formula expressing the intensity of output light emerging from the analyzer 57, V is the voltage developing in the object to be measured, and $V_0$ is a half-wave voltage.

In the comparator circuit 61, the intensity of reference light produced from the photoelectric converter 55, or I/2, is compared with the intensity of output light produced from the other photoelectric converter 58, or $(I/4)\sin^2[(\pi/2)V/V_0]$.

The intensity of output light, or $(I/4)\sin^2[(\pi/2)V/V_0]$, will vary with the change in the refractive index of the tip 63 of the electro-optic material 62 that occurs as a result of the change in voltage. Therefore, this intensity can be used as a basis for detecting the voltage developing in a selected area of the object to be measured, say, an integrated circuit.

As described above, in using the voltage detector 50 shown in FIG. 7, the tip 63 of the optical probe 52 is brought close to the object to be measured and the resulting change in the refractive index of the tip 63 of the electro-optic material 62 is used as a basis for detecting the voltage developing in a selected area of the object of interest. Therefore, the voltage developing in fine-line portions of a small and complicated object such as an integrated circuit which are difficult to be contacted by a probe or which cannot be contacted by a probe without affecting the voltage being measured can be effectively detected by the detector 50 without bringing the optical probe 52 into contact with such fine-line portions. If desired, a pulse light source such as a laser diode that produces light pulses of a very short pulse width may be used as a light source to ensure that rapid changes in the voltage on the object to be measured are sampled at extremely short time intervals. Rapid changes in the voltage on the object of interest can be measured with a very high time resolution by using a CW light source and a quick-response detector such as a streak camera. Either method is capable of precision detection of rapid changes in voltage.

However, in the voltage detector 50 shown in FIG. 7 where the voltage developing in a selected area of an object of interest is measured by making use of the change in the polarization of a light beam in the electro-optic material 62, it is necessary to extract a predetermined component of linear polarization not only from the light beam from the light source 53 by means of the polarizer 54 but also from emerging light from the electro-optic material 62 by means of the analyzer 57. In order to satisfy these needs, the efficiency of utilization of light beams is inevitably reduced. Another problem of the voltage detector 50 is that because of the use of the beam splitter 56 the analyzer 57 can receive only a weak emerging beam whose intensity is much smaller than that of the light beam issuing from the light source 53 and this has put limits on the precision of voltage detection. Furthermore, the polarizer 54, analyzer 57 and beam splitter 56 add to the number of components of the optical system and have put limits on the effort to improve its precision significantly.

If a streak camera instead of a photoelectric converter is used as the detector in the voltage detector shown in FIG. 7, the change in the voltage occurring in a selected area of the object to be measured is detected as an one-dimensional distribution of light intensity on the phosphor screen of the streak camera. Therefore, in order to determine the waveform of the voltage, a predetermined conversion processing must be performed on the resulting one-dimensional distribution of light intensity.

The method of detecting the voltage in a selected area of the object of interest in accordance with the change in the polarization of light has one more serious problem; that is, this method is only capable of detecting the absolute value of the voltage and is unable to determine its polarity (i.e., whether it is positive or negative).

SUMMARY OF THE INVENTION

An object, therefore, of the present invention is to provide a voltage detector that employs a simple optical system and yet is capable of direct and precise detection of a voltage waveform at a selected area of an object to be measured.

Another object of the invention is to provide a voltage detector which can detect voltages in one-dimensional positions of an object with relatively simple processing.

A further object of the invention is to provide a voltage detector which can detect a voltage in an object including its polarity.

These objects of the present invention can be attained by a voltage detector which generally comprises a pulse light source for emitting pulse light, a delay means for gradually delaying the pulse light, an optical path changing means that is formed of an electro-optic material and allows the pulse light from the delay means to be outputted with its optical path inside the material corresponding to a refractive index of the material, and a detection means for detecting the output pulse light from the optical path changing means. This voltage detector measures by sampling the voltage developing in a selected area of the object of interest.

In the present invention, pulse light issuing from the pulse light source is gradually delayed by the delay means and is thereafter launched into the optical path changing means, say, a dispersing prism, formed of an electro-optic material. The incident pulse light emerges from the optical path changing means either as transmitted light or as reflected light, which travels on a optical path in accordance with the refractive index of said optical path changing means. The refractive index of the optical path changing means varies with the electric filed produced by the voltage developing in a selected area of the object to be measured. Thus, the optical path of the transmitted light or reflected light emerging from said optical path changing means will also vary with the voltage in a selected area of the object of interest. By detecting the resulting change in the optical path of the emerging transmitted or reflected light with the detection means, say, a linear image sensor, part of the waveform of the voltage passing through a selected area of the object of interest can be measured by sampling. By repeating similar sampling measurements on the pulse light that is gradually delayed with the delay means, the waveform of the voltage to be measured can be detected on a serial time basis. The detected voltage waveform is such that one is able to determine the polarity of the voltage (whether it is positive or negative).

Other and further objects, features and advantages of the invention will appear more fully from the following description taken in connection with the accompanying drawings.

DETAILED DESCRIPTION OF THE INVENTION

Two embodiments of the present invention are described hereinafter with reference to the accompanying drawings.

Figure 1:
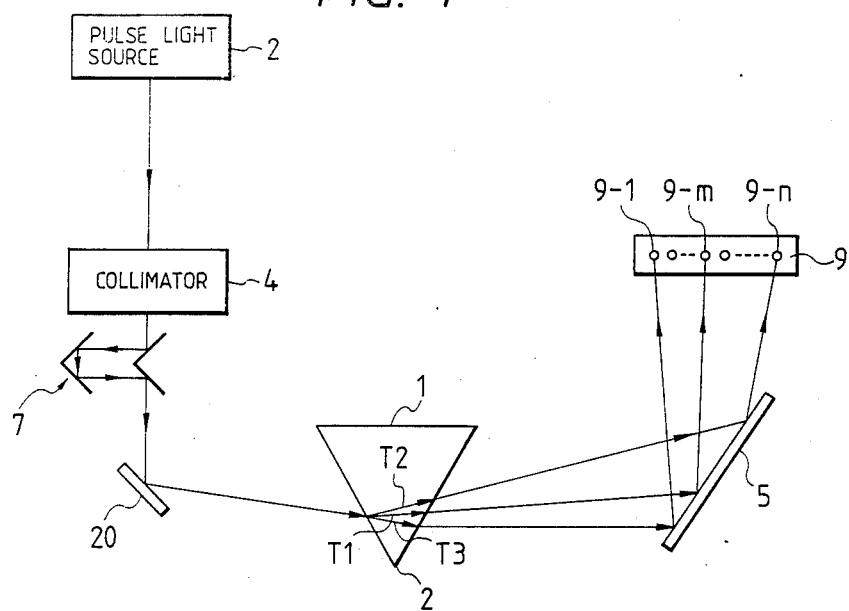
FIG. 1, shows schematically the composition of a voltage detector according to the first embodiment of the present invention.

FIG. 1 shows schematically the composition of a voltage detector according to the first embodiment of the present invention.

The voltage detector shown in FIG. 1 uses a dispersing prism 1 that is made of an electro-optic material, say, lithium tantalate ($LiTaO_3$) in an optically uniaxial crystal form. The refractive index of the prism 1 changes in accordance with the voltage in a selected area of the object to be measured (not shown) when the downward apex 2 of the prism 1 is brought close to said object.

Figure 2:
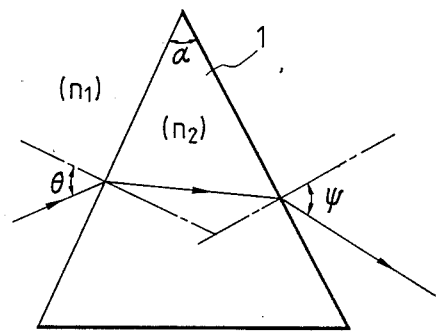
FIG. 2 shows conceptually an optical path of a ray launched into a dispersing prism.

The dispersing prism 1 receives pulse light that emanated from a pulse light source 2 and passed through a collimator 4, a delay means 7 and a mirror 20. The incident pulse light travels through the prism 1 on an optical path that is determined by the refractive index of the prism 1 and thereafter emerges from the prism 1 as transmitted light. If, as shown in FIG. 2, pulse light is launched from a surrounding space (refractive index, $n_1$) into the prism 1 (refractive index, $n_2$) at an angle of $\theta$ with respect to the normal to the entrance face of the prism 1, transmitted light emerges from the prism 1 at an angle of $\psi$ that satisfies the following relationship:

$$\sin\psi = \sin\alpha \cdot \sqrt{n^2 - \sin^2\theta} - \cos\alpha \cdot \sin\theta \quad (1)$$

where $\alpha$ is the apex angle of the prism and n is the relative refractive index ($n_2/n_1$). If the apex angle $\alpha$ is 60°, $$\sin\psi = (1/2) \cdot [\sqrt{3(n^2 - \sin^2\theta)} - \sin\theta]. \quad (2)$$

If the refractive index of the dispersing prism 1 increases with voltage application, this causes an increase in the angle of emergence $\psi$.

The transmitted light from the prism 1 is reflected by a given angle from a mirror 5 and is launched into a linear image sensor 9 consisting of an one-dimensional array of imaging elements.

In the voltage detector having the composition described above, pulse light from the pulse light source 2 passes through the collimator 4, delay means 7 and mirror 20 and is launched into the dispersing prism 1.

When no voltage is applied to the prism 1, the pulse light launched into the prism 1 travels through it on an optical path T1 and emerges therefrom as transmitted light. The exit beam is reflected from the mirror 5 and enters an imaging element 9-m in one-dimensional array in the linear image sensor 9.

When a voltage, say, a positive voltage developing in a selected area of the object to be measured is applied to the prism 1, the refractive index of the prism 1 made of the electro-optic material is changed and the pulse light from the light source 2 travels through the prism 1 on an optical path T2. The transmitted light emerging from the prism 1 is reflected from the mirror 5 and enters an imaging element 9-n in the linear image sensor 9.

When a negative voltage is applied to the prism 1, the pulse light from the light source 2 travels through the prism 1 on an optical path T3. The transmitted light emerging from the prism 1 is reflected from the mirror 5 and enters an imaging element 9-1 in the linear image sensor 9.

Figure 3A:
FIGS. 3(a) and 3(b) are timing charts of voltage pulses and light pulses, respectively.
Figure 3B:
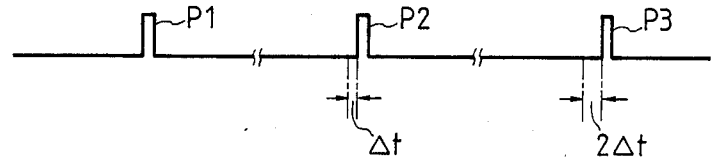

In the embodiment under discussion, the voltage occurring in a selected area of the object to be measured consists of periodically repeating pulses and the pulse light from the light source 2 is in synchronism with the repeating period of these voltage pulses. Therefore, by gradually delaying a phase of the pulse light with the delay means 7, the pulses of voltage in a selected area of the object of interest can be measured through sampling at the linear image sensor 9. FIG. 3 shows timing charts that illustrate how the voltage pulses are measured by sampling. FIG. 3(a) shows the periodic occurrence of voltage pulses. In this case, pulse light is delayed in time by an increment of $\Delta t$ as shown in FIG. 3(b). As a result, in response to the incidence of pulse light beams P1, P2 and P3, parts W1, W2 and W3 of voltage pulses are measured on a serial time basis with the linear image sensor 9. In accordance with the embodiment being discussed, the polarity of the parts of voltage pulses (W1 and W2 are positive and W3 is negative) can be determined in terms of the change in the optical path of pulse light P1, P2 or P3.

As described above, in the first embodiment of the present invention, the refractive index of the dispersing prism 1 changes in accordance with the voltage developing in a selected area of the object to be measured and this change causes a corresponding change in the optical path of pulse light that is transmitted through the prism. By making use of this change in optical path, the waveform of the voltage varying at a selected area of the object of interest can be detected in such a way that the polarity of the detected voltage can also be determined.

In the first embodiment of the present invention, a polarizer and an analyzer need not be used to extract a predetermined polarization component, that is, a linearly polarized light beam. Furthermore, this embodiment does not require a beam splitter and the resulting improvement in the efficiency of utilization of light is such that the linear image sensor 9 as a detector can be supplied with transmitted light that is substantially equal in intensity to the pulse light issuing from the pulse light source 2. As a further advantage, the elimination of a polarizer, an analyzer and a beam splitter results in a corresponding decrease in the number of components of the optical system. As a consequence of these advantages, voltage detection with improved precision and sensitivity can be accomplished in the first embodiment of the present invention.

Figure 4:
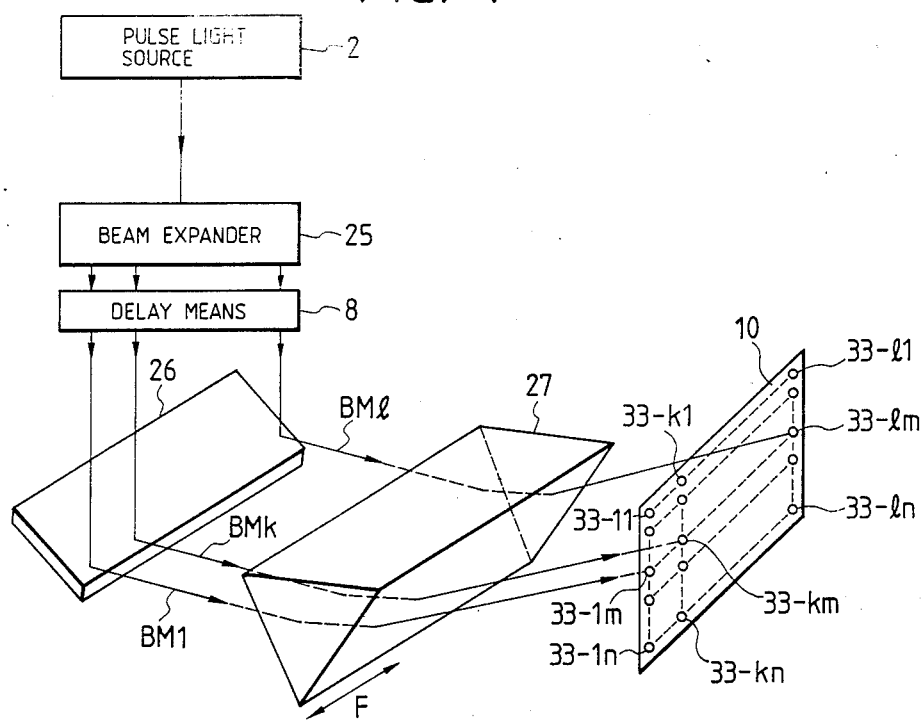
FIG. 4 shows schematically part of the composition of a voltage detector which is a modification of the voltage detector shown in FIG. 1.

FIG. 4 shows schematically part of the composition of a voltage detector which is a modification of the voltage detector shown in FIG. 1. In the voltage detector shown in FIG. 4, pulse light from a pulse light source 2 is collimated with a beam expander 25 and is passed through a delay means 8 and a mirror 26 to be launched into a dispersing prism 27. Parallel beams, BM1, ... BMk, ... and BMl launched into the prism 27 travel through it on optical paths that depend on the change which occurs in the refractive index of the prism in accordance with the voltage at one-dimensional positions of the object of interest in a direction of an axial line F. The beams emerging from the prism 27 are launched into a two-dimensional detector 10 such as a CCD camera or a vidicon camera.

The light beam BM1 is launched into either one of the imaging elements 33-11, ..., 33-1m, ... and 33-1n in the two-dimensional detector 10 in accordance with the change in the refractive index of the prism 27; the light beam BMk is launched into either one of the imaging elements 33-k1, ..., 33-km, ... and 33-kn; and the light beam BMl is launched into either one of the imaging elements 33-l1, ..., 33-lm, ... and 33-ln.

In the voltage detector having the composition described above, when the voltage developing in the object to be measured changes in the direction of the axial line F, the refractive index of an area of the prism 27 that corresponds to selected positions of the object also changes and this causes a corresponding change in the optical paths of light beams BM1, BMk, and BMl that are to emerge from the prism 27. The change in the optical paths of light beams BM1, ..., BMk, ... and BMl which are launched into the two-dimensional detector 10 reflects the results of sampling of part of the one-dimensional waveform of the voltage pulse developing in the object of interest. Therefore, by gradually delaying the light beams BM1, ..., BMk, ... and BMl with the delay means 8, the one-dimensional waveform of periodically varying voltage pulses in the object of interest can be sampled on a serial time basis with the two-dimensional detector 10.

Thus, in accordance with the modification shown in FIG. 4, the voltages occurring at one-dimensional positions of the object of interest can be detected simultaneously.

In the above modification, the positions of the beam expander 25 and the delay means 8 may be interchanged.

Figure 5:
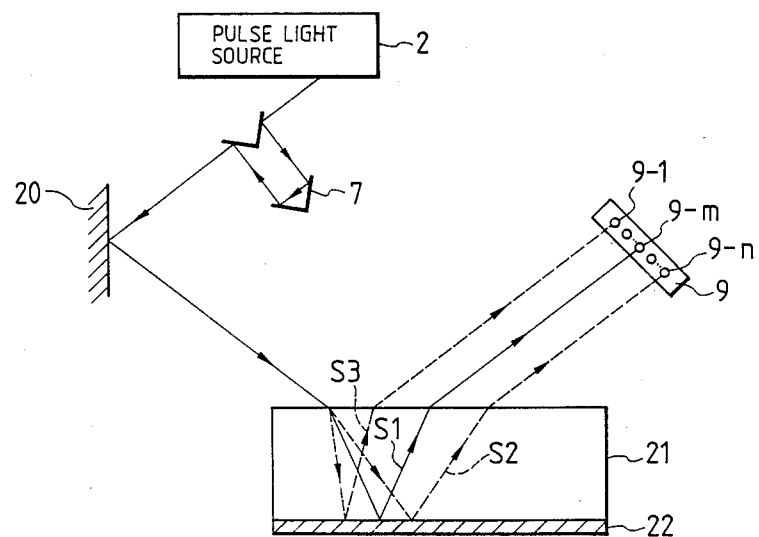
FIG. 5 shows schematically the composition of a voltage detector according to the second embodiment of the present invention.

FIG. 5 shows schematically the composition of a voltage detector according to the second embodiment of the present invention.

The voltage detector shown in FIG. 5 is common to that shown in FIG. 1 in that it includes a pulse light source 2, a delay means 7 and a linear image sensor 9 as an one-dimensional detector.

What is unique about the voltage detector shown in FIG. 5 is that the pulse light from the pulse light source 2 is passed through the delay means 7 and mirror 20 to be launched into an electro-optic material 21 in an optically uniaxial crystal form that is furnished with a reflection mirror 22 in the form of a thin metal film or a multilayered dielectric film. The pulse light launched into the electro-optic material 21 is reflected by the mirror 22 and emerges from the material 21 to be supplied to the linear image sensor 9.

When no voltage is applied to the electro-optic material 21 in the voltage detector having the composition described above, the pulse light from the light source 2 travels through the electro-optic material 21 on an optical path S1 and the emerging reflected light is launched into an imaging element 9-m in the linear image sensor 9. When a positive (or negative) voltage is applied to the electro-optic material 21, the pulse light from the light source 2 travels through the electro-optic material 21 on an optical path S3 (or S2) and the emerging reflected light is launched into an imaging element 9-1 (9-n). In this way, the light beam traveling through the electro-optic material 21 changes its optical path in accordance with the voltage being applied to said material 21 and the reflected light from the material 21 is launched into an imaging element that corresponds to a particular optical path.

As a result, the voltage detector shown in FIG. 5, like the one shown in FIG. 1, ensures that the waveform of voltage pulses varying at a selected area of the object of interest is measured by sampling on a serial time basis in such a way that the polarity of the detected voltage can also be determined. Furthermore, a polarizer, an analyzer and a beam splitter are eliminated to reduce the number of components of the optical system, thereby enhancing the efficiency of utilization of light to such an extent that very precise and sensitive voltage detection can be achieved.

Figure 6:
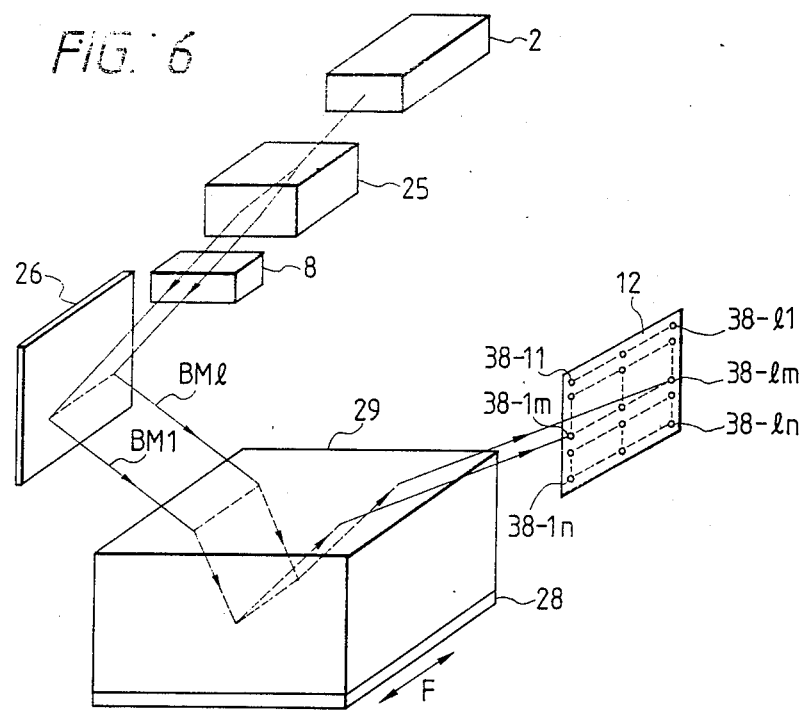
FIG. 6 shows schematically part of the composition of a voltage detector which is a modification of the voltage detector shown in FIG. 5.
Figure 7:
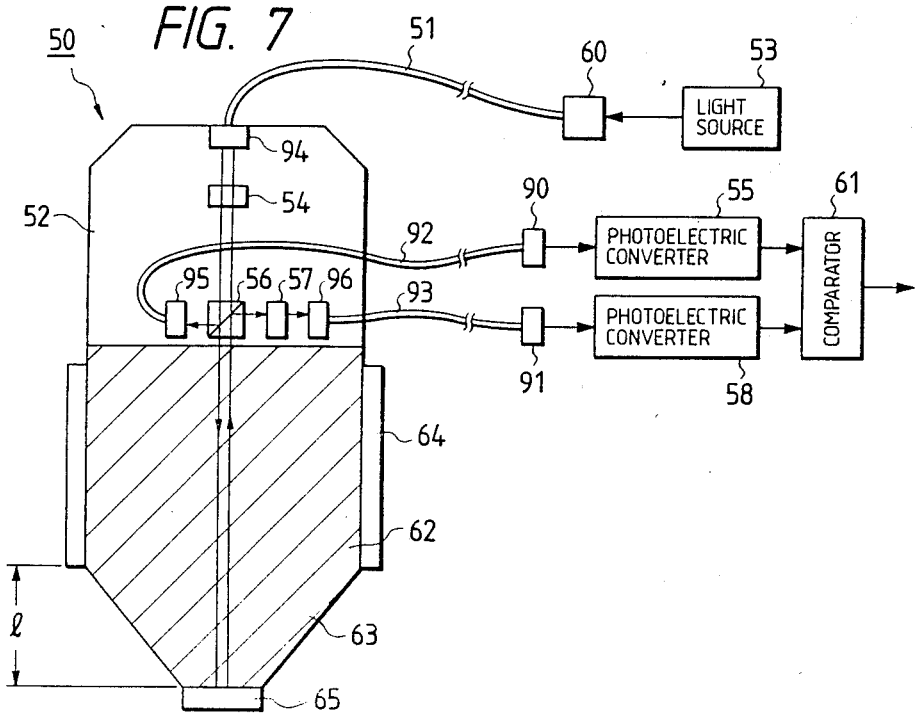
FIG. 7 is a schematic drawing of a voltage detector which was proposed in Japanese Patent Application No. 137317/1987.

FIG. 6 shows schematically part of the composition of a voltage detector which is a modification of the voltage detector shown in FIG. 5.

In the voltage detector shown in FIG. 6, pulse light from a pulse light source 2 is collimated with a beam expander 25 and is passed through a delay means 8 and a mirror 26 to be launched into an electro-optic material 28 in an optically uniaxial crystal form that is furnished with a reflection mirror 28 in the form a thin metal film or a dielectric multilayer film. Parallel beams BM1 to BMl launched into the electro-optic material 29 travel through it on optical paths that depend on the change which occurs in the refractive index of said material 29 in accordance with the voltage at one-dimensional positions of the object of interest in a direction of an axial line F. The beams emerging from the electro-optic material 29 on their respective optical paths are launched into a two-dimensional detector 12 such as a CCD camera or a vidicon camera. The light beam BM1 is launched into either one of the imaging elements 38-11 to 38-1n in the detector 12 in accordance with the change in the refractive index of the electro-optic material 29; and the beam BMl is launched into either one of the imaging elements 38-l1 to 38-ln.

In accordance with the voltage detector having the composition described above, by gradually delaying parallel beams of pulse light with the delay means 8, the waveform of voltage pulses in a selected area of the object of interest can be measured by sampling in terms of the change in the optical paths of light beams BM1 to BMl, which enables them to be detected on a serial time basis by means of the two-dimensional detector 12.

Thus, as in the case of the voltage detector shown in FIG. 4, the voltages occurring at one-dimensional positions of the object of interest can be detected simultaneously in accordance with the modification shown in FIG. 6.

In the above modification, the beam expander 25 and the delay means 8 may be replaced with each other.

The description of the foregoing embodiments assumes that each of the dispersing prisms 1 and 27 and electro-optic materials 21 and 29 is made of an optically uniaxial crystal. However, none of these embodiments rely for their operation on the change in the polarization of light beam, so the prisms 1 and 27 and electro-optic materials 21 and 29 need not to be made of an optically uniaxial crystal and may instead be formed of an isotropic crystal.

The description of the foregoing embodiments also assumes that the downward apex of the dispersing prism or the tip of the electro-optic material is not brought into contact with the object to be measured. If desired, they may be placed in contact with the object of interest.

As described on the foregoing pages, the voltage detector of the present invention gradually delays the pulse light from the pulse light source and allows the incident light on the optical path changing means to emerge from it on the optical path that depends on its refractive index, with each of the emerging beams traveling on their respective optical paths being detected by sampling with the detection means. As a result, the waveform of voltage pulses that varies at a selected area of the object to be measured can be directly detected with the detection means in such a way that the polarity of the detected voltage can also be determined. In addition, as the number of components of the optical system is decreased and the light beam from the light source is effectively utilized for detection purposes without suffering any substantial loss in its intensity, the voltage detector of the present invention ensures precise and sensitive detection of the voltage developing in a selected area of the object to be measured.

What is claimed is:

1. A voltage detector for detecting a waveform of a periodic voltage developing in a selected area of an object, comprising:
    a pulse light source for emitting a pulse light beam in synchronism with the waveform of said voltage in said object;
    delay means for gradually delaying said pulse light beam;
    optical path changing means including an electro-optic material, for changing an optical path of said pulse light beam received from said delay means responsive to a change of refractive index of said electro-optic material, said change of refractive index being caused by an electric field produced to said voltage in said object; and
    detection means for detecting an output pulse light beam emerging from said optical path changing means and determining said waveform of said voltage.

2. A voltage detector as claimed in claim 1, wherein said optical path changing means is a dispersing prism made of said electro-optic material, whose apex portion is put close to or in contact with said selected area in said object and which transmits said pulse light beam.

3. A voltage detector as claimed in claim 2, wherein said detection means is a linear image sensor.

4. A voltage detector as claimed in claim 2, further comprising a beam expander disposed between said pulse light source and said delay means, for making parallel pulse light beams; wherein said apex portion extends along one-dimensional positions in said object, and said detection means is a two-dimensional detector for detecting output parallel pulse light beams emerging from said optical path changing means and determining waveforms of voltages developing in said one-dimensional positions.

5. A voltage detector as claimed in claim 4, wherein said two-dimensional detector is a CCD camera.

6. A voltage detector as claimed in claim 4, wherein said two-dimensional detector is a vidicon camera.

7. A voltage detector as claimed in claim 1, wherein said optical path changing means further has a reflection mirror which is attached to said electro-optic material and reflects said pulse light beam, and said voltage is applied through said reflection mirror to said electro-optic material.

8. A voltage detector as claimed in claim 7, wherein said detection means is a linear image sensor.

9. A voltage detector as claimed in claim 7, further comprising a beam expander disposed between said pulse light source and said delay means, for making parallel pulse light beams; wherein said reflection mirror extends along one-dimensional positions in said object, and said detection means is a two-dimensional detector for detecting output parallel pulse light beams emerging from said optical path changing means and determining waveforms of voltages developing in said one-dimensional positions.

10. A voltage detector as claimed in claim 9, wherein said two-dimensional detector is a CCD camera.

11. A voltage detector as claimed in claim 9, wherein said two-dimensional detector is a vidicon camera.

* * * * *